United States Patent [19]

Rostoker et al.

[11] Patent Number: 5,572,562
[45] Date of Patent: Nov. 5, 1996

[54] IMAGE MASK SUBSTRATE FOR X-RAY SEMICONDUCTOR LITHOGRAPHY

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 328,555

[22] Filed: Oct. 25, 1994

Related U.S. Application Data

[63] Continuation of Ser. No. 56,334, Apr. 30, 1993, abandoned.

[51] Int. Cl.$^6$ ........................................ G21K 5/00
[52] U.S. Cl. ........................................ 378/34; 378/35
[58] Field of Search ........................................ 378/34, 35

[56] References Cited

U.S. PATENT DOCUMENTS

| | | | |
|---|---|---|---|
| Re. 33,992 | 7/1992 | Nagel et al. | 378/34 |
| 3,436,353 | 4/1969 | Dreyer et al. | 252/300 |
| 3,441,346 | 4/1969 | Naidich et al. | 355/77 |
| 3,598,471 | 8/1971 | Baldwin et al. | 350/162 |
| 3,680,956 | 8/1972 | Custer | 335/71 |
| 3,758,207 | 9/1973 | Letzer | 355/80 |
| 4,018,938 | 4/1977 | Feder et al. | 378/35 |
| 4,022,927 | 5/1977 | Pfeiffer et al. | 427/43 |
| 4,025,191 | 5/1977 | Seward, III | 355/71 |
| 4,436,797 | 3/1984 | Brady et al. | 430/5 |
| 4,825,453 | 4/1989 | Kembo et al. | 378/34 |
| 4,855,197 | 8/1989 | Zapka et al. | 430/5 |
| 5,055,871 | 10/1991 | Pasch | 355/53 |
| 5,127,029 | 6/1992 | Suzuki et al. | 378/34 |
| 5,139,904 | 8/1992 | Auda et al. | 430/30 |
| 5,196,283 | 3/1993 | Ikeda et al. | 430/5 |

*Primary Examiner*—Craig E. Church
*Attorney, Agent, or Firm*—John P. Taylor

[57] ABSTRACT

Fine, sub-micron line features and patterns are created in a sensitized layer on a semiconductor wafer by a source of X-ray radiation. The X-ray source emits very low wavelength radiation along a path towards a sensitized surface of a semiconductor wafer. An image mask substrate is disposed in the path of the radiation, and is provided with a patterned opaque material on a surface of a substrate thereof. The substrate is formed of beryllium, which is robust and has a thermal coefficient of expansion closely conforming to that of common image mask carriers. Further, a wide variety of opaqueing materials adhere well to the beryllium substrate, and the substrate is relatively insensitive to moisture. The image mask is spaced sufficiently close to the wafer that radiation passing through the mask forms a corresponding pattern in the surface of the wafer. For X-ray radiation, the opaqueing material is gold, tungsten, platinum, barium, lead, iridium, rhodium, or the like.

10 Claims, 5 Drawing Sheets

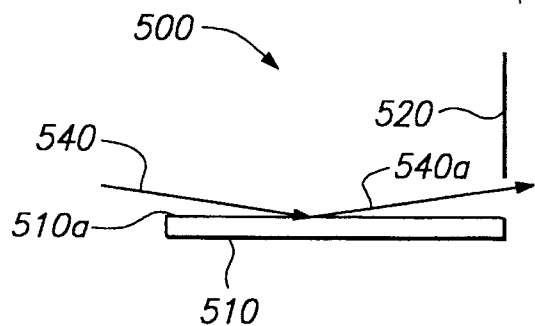
FIGURE 5a
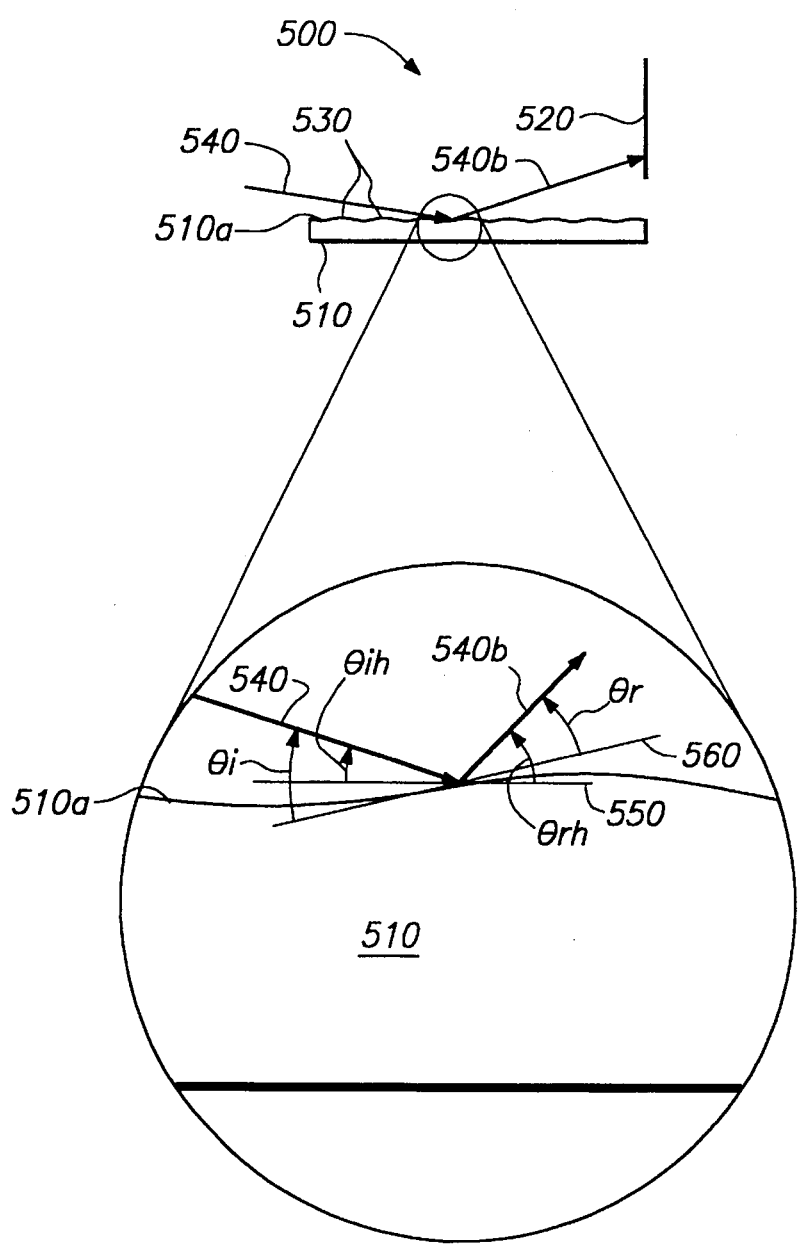
FIGURE 5b
FIGURE 5c

1

IMAGE MASK SUBSTRATE FOR X-RAY SEMICONDUCTOR LITHOGRAPHY

This a continuation of application Ser. No. 08/056,334, filed on Apr. 30, 1993, and now abandoned.

TECHNICAL FIELD OF THE INVENTION

The present invention relates to techniques for manufacturing semiconductor devices and, more particularly, to techniques for forming patterned features on a semiconductor device.

BACKGROUND OF THE INVENTION

Photolithography is a common technique employed in the manufacture of semiconductor devices. Typically, a semiconductor wafer is coated with a layer of light sensitive resist material (photoresist). Using a patterned mask or reticle, the wafer is exposed to projected light from an illumination source, typically actinic light, which manifests a photochemical effect on the photoresist, which is ultimately (typically) chemically etched away, leaving a pattern of photoresist "lines" on the wafer corresponding to the pattern on the mask or reticle. The patterned photoresist on the wafer is also referred to as a mask, and the pattern in the photoresist mask replicates the pattern on the image mask (or reticle).

As used in the main, hereinafter, with respect to semiconductor lithography, the term "upstream" means towards the illumination or radiation source, and "downstream" means away from the illumination source (or, towards the wafer). For example, a lens in the illumination path of photolithographic apparatus has an upstream side facing the illumination source and a downstream side facing away from the illumination source.

FIG. 1 shows a simplified prior-art photolithographic apparatus 110 for exposing a semiconductor wafer (W), more particularly a coating thereon (e.g., photoresist), to light. An optical path is defined from left to right in FIG. 1, as viewed. Prior to exposure, the semiconductor wafer (W) typically receives on its front surface a layer of photoreactive material (not shown), such as photoresist.

A light source 112 emits actinic light, and may be backed up by a reflector 114. Light emitted by the light source typically passes through a uniformizer 116, such as a "fly's eye" lens or a light pipe.

Light exiting the uniformizer 116 is represented by rays 118a, 118b, and 118c, and passes through a condenser lens 120. The ray 118b represents the optical axis of the photolithographic apparatus. The light source 112, reflector 114, uniformizer 116 and condenser lens 120 form what is termed an "illuminator" which is often detachable as a unit from the photolithographic apparatus.

An image mask 122 ("M") is disposed "downstream" of the condenser lens 120, at the focal plane (point) thereof. One type of image mask used in the photolithography process is a chromed glass or quartz plate bearing the pattern to be projected onto the photoresist layer. Light is projected through the image mask, and those areas of the image mask which are not chromed allow the light to expose the photoresist, while those areas of the image mask which are chromed prevent the light from exposing the photoresist. The exposed areas of the photoresist typically resist chemical etching, while the unexposed areas can readily be removed, leaving a pattern of photoresist on the surface of the wafer.

Further downstream along the light path, the rays diverge from the mask 122, and pass through a "taking" (imaging) lens 124. Because of its imaging function, the taking lens 124 must be of relatively high quality as compared with the condenser lens 120. The mask 122 is disposed at a common focal point of the two lenses 120 and 124.

A semiconductor wafer (W) is disposed at the "downstream" focal plane, or image plane, of the taking lens 124. Those areas of the mask (or reticle) which are not chromed allow the light to expose a photoreactive layer (e.g., photoresist) on the surface of the wafer (W), while those areas of the mask which are chromed (or otherwise opaquely patterned) prevent the light from exposing the photo-reactive layer. The photoreactive layer is typically a photoresist material. The exposed areas of the photoresist resist chemical etching and, in subsequent processing, are used to form defined features on the wafer (such as on a layer of polysilicon underling the photoresist).

The resist materials used in photolithography are typically organic. Typical resist materials for visible light photolithography include mixtures of a casting solvent, such as ethyl lactate, and novolac resin (diazoquinone).

Inasmuch as the light passing through the image mask (reticle) has an inherent characteristic that induces photochemical activity in the photoresist material, such radiation (e.g., light) is termed "actinic".

In current photolithographic apparatus, light having at least a substantial visible content is typically employed. Visible light has a frequency on the order of $10^{15}$ Hz (Hertz), and a wavelength on the order of $10^{-6}$–$10^{-7}$ meters.

The following terms are well established: 1 µm (micrometer) is $10^{-6}$ meters; 1 nm (nanometer) is $10^{-9}$ meters; and 1 Å (Angstrom) is $10^{-}$meters.

Among the problems encountered in photolithography are non-uniformity of source illumination and point-to-point reflectivity variations of photoresist films. Both of these features of current photolithography impose undesirable constraints on further miniaturization of integrated circuits. Small and uniformly sized features are, quite evidently, the object of prolonged endeavor in the field of integrated circuit design. Generally, smaller is faster, and the smaller the features that can be reliably fabricated, the more complex the integrated circuit can be.

With regard to uniformity of source illumination, attention is directed to commonly-owned U.S. Pat. No. 5,055,871, issued to Pasch. As noted in that patent, non-uniformities in the illuminating source will result in non-uniformities of critical dimensions (cd) of features (e.g., lines) formed on the semiconductor device, and the illumination uniformity of photolithographic apparatus will often set a limit to how small a feature can be formed. There usually being a small "error budget" associated with any integrated circuit design, even small variations in illumination intensity can be anathema to the design goals.

with regard to reflectivity of photoresist films, it has been observed that minor thickness variations in a photoresist film will cause pronounced local variations in how efficiently the illuminating light is absorbed (actinically) by the photoresist film, which consequently can adversely affect the uniformity of critical dimensions (cd) of features (such as polysilicon lines or gates) sought to be formed in a layer underlying the photoresist. This problem is addressed in commonly-owned, copending U.S. patent application Ser. No. 07/906,902, filed Jun. 29, 1992 by Michael D. Rostoker, which discussed techniques for applying a substantially uniform thickness layer of photoresist, and which is incorporated by reference herein.

Another, more serious problem with photolithography is one of its inherent resolution. The cd's of the smallest features of today's densest integrated circuits are already at sub-micron level (a "micron" or "μm" is one millionth of a meter). Such features are only slightly larger than a single wavelength of visible light, severely pushing the limits of the ability of visible light techniques to resolve those features. As integrated circuit features become smaller, the demand for more nearly "perfect" optical components increases. At some point, however, such optics become impractical and inordinately expensive, or even impossible to produce. Although the resolving power of light, vis-a-vis submicron semiconductor features is being stretched to its limit, the ability to etch (wet, dry, chemical, plasma) features on a semiconductor wafer is not limited by wavelength.

As is well known, ultraviolet light (UV) is slightly higher (in frequency) on the electromagnetic spectrum than visible light. Typically, ultraviolet light has a frequency on the order of $10^{15}$–$10^{17}$ Hz, and has a wavelength on the order of $10^{-7}$–$10^{-8}$ meters. Ultraviolet light is known to be actinic, for example with respect to skin pigmentation. Due to its shorter (than visible light) wavelength, ultraviolet light would seem to hold promise for increased resolution in integrated circuit photolithography. However, it is difficult to find reliable, fluent sources of UV (typically vacuum UV) light. Further, the performance of present day optics begins to degrade substantially at around 190 nm ($1.9 \times 10^{-7}$ meters; which is towards the top of the visible light spectrum), and is not well suited for focusing UV light.

In contrast to visible light, X-rays have a much shorter wavelength. Typically, X-rays have a frequency on the order of $10^{17}$–$10^{20}$ Hz, and have a wavelength on the order of $10^{-8}$–$10^{-11}$ meters. Evidently, due to their shorter wavelength, X-rays have the inherent capability of providing better resolution than visible light. However, as with UV sources, there are some problems with obtaining reliable emission sources that exhibit good fluence. The best (most intense) X-ray sources (e.g., X-ray tubes) produce X-rays in the range of 1–10 Å in wavelength, with a nominal output spectrum between 2 Å and 6 Å in wavelength.

Gamma-rays exhibit an even shorter wavelength than X-rays. Typically, Gamma-rays have a frequency on the order of $10^{19}$–$10^{22}$ Hz, and have a wavelength on the order of $10^{-10}$–$10^{-12}$ meters. Evidently, Gamma-rays provide the potential for even better resolution than X-rays. Furthermore, gamma-ray sources providing intense streams of fluent emission are readily available, such as in the form of Cobalt-60.

In the absence of the novel viable gamma-ray and X-ray semiconductor-processing techniques disclosed herein, various techniques for "stretching" the resolution of UV and visible light techniques have been contemplated. One such technique provides a method of forming short-channel polysilicon gates (0.6 μm polysilicon feature size). (See, for example, U.S. Pat. No. 5,139,904, issued Aug. 18, 1992 to Auda et al.) This method employs a technique of laying down a layer of conventional photoresist over a polysilicon layer and patterning the photo-resist to "normal" dimensions (greater than the ultimately desired 0.6 μm dimension). The photo-resist pattern is then uniformly eroded in all dimensions using an isotropic (non-directional) RIE (reactive ion etching) etch process. The size of features in the photo-resist pattern is carefully monitored during the etch process. When the pattern features are eroded to the desired size, the etch process is stopped. An anisotropic (highly directional) etch process is used to etch away portions of the underlying polysilicon outside of the "shadow" of the eroded photo-resist pattern (relative to a generally vertical etch direction).

While this technique may be employed to produce small polysilicon structures, it has the same limitations as conventional photolithography with respect to line-to-line spacing. Because the photoresist is initially patterned to "conventional" dimensions, it is not possible with such "stretched" techniques to space pattern features substantially closer with sufficient resolution than is ordinarily possible with conventional photolithography.

DISCLOSURE OF THE INVENTION

It is therefore an object of the present invention to provide improved techniques for fabricating semiconductor devices.

It is another object of the present invention to provide improved techniques for forming ultra-fine features on a semiconductor device.

It is another object of the present invention to provide techniques for forming features on a semiconductor device which are not limited by the resolving power of light.

It is another object of the present invention to provide wafer processing techniques which yield improved critical dimensions (cd's) in semiconductor features.

It is another object of the present invention to provide techniques capable of resolving smaller features (such as polysilicon or metal lines).

It is another object of the present invention to provide near-field afocal techniques for processing semiconductor wafers.

It is another object of the present invention to provide X-ray lithographic techniques.

It is another object of the present invention to provide gamma ray lithographic techniques.

It is another object of the present invention to provide means for "shuttering" gamma rays or X-rays.

As used herein, the term "lithography" refers to any technique which is employed to define features on a semiconductor wafer, for example patterning photoresist overlying a layer that will subsequently be etched. Generally, all of the lithography techniques discussed hereinbelow employ some form of illumination (or radiating) source.

According to the invention, lithography is performed on a semiconductor device using electromagnetic energy of shorter, or of substantially shorter wavelength, than visible or UV light.

In one embodiment of the invention, X-rays are used as the illumination (radiation) source.

According to an aspect of the invention, Beryllium is used as transparent image mask substrate for imaging X-rays onto a semiconductor wafer. Beryllium has excellent transparency to X-rays, and since it is a metal itself, carriers and opaque masking materials can be readily provided which have similar expansion coefficients, resulting in relatively low distortion of the mask.

According to various aspects of the invention, Gold, Tungsten, Platinum, Barium, Lead, Iridium, or Rhodium are used as opaque mask materials to be deposited over a Beryllium substrate (image mask). All of these materials exhibit excellent opacity to X-rays. Further, these materials exhibit adequate adhesion to Beryllium (the image mask substrate) and adequate environmental robustness for utility as lithographic image masks.

The resulting image mask (beryllium substrate with a pattern of opaque lines on a surface thereof) is suitably employed for "near field" lithography. By "near field" it is meant that the process is afocal, and by spacing the image mask close to the semiconductor wafer there is limited opportunity for the radiation passing through the image mask to spread.

In another embodiment of the invention, Gamma-rays are used as the lithographic illumination source.

According to an aspect of the invention, "base" organic resist materials applied to the semiconductor die (wafer) are doped either with organic or with inorganic materials (dopants) which exhibit high absorptivity to gamma-rays, to enhance the sensitivity of the resist material. Preferably, the dopant is inorganic. Examples of organic dopants include polystyrene, phenolformaldehyde, polyurethane, etc. Examples of inorganic dopants include bromine, chromium, tantalum, gold, platinum, palladium, lead, barium, boron, aluminum and magnesium. The dopants are highly reactive to incident gamma radiation, and produce secondary photon emissions of a different wavelength (longer) than that of the incident gamma rays. The organic resist base, which is not ordinarily reactive to gamma radiation, is however highly absorptive of these secondary emissions (from the dopants), which are actinic with respect to the organic resist base, thereby causing the resist base to become chemically converted. The high cross-section (absorptivity) of the organic resist base to the secondary emissions also limits the amount of "blooming" (spreading) inherent in the secondary emissions.

According to another aspect of the invention, an organic resist material has an absorptive (to gamma radiation) film of material disposed on a surface thereof. The film atop the photoresist is organic or inorganic, preferably inorganic, and provides secondary emissions (photons) which convert the underlying photoresist. The film is termed a "secondary resist layer". Examples of organic resist materials suitable for the secondary resist layer include polystyrene, phenolformaldehyde, polyurethane, etc. Examples of inorganic secondary resist materials suitable for the secondary resist layer include bromine, chromium, tantalum, gold, platinum, palladium, lead, barium, boron, aluminum and magnesium. The secondary resist layer, when exposed to gamma radiation, produces secondary photon emissions of a different wavelength (longer) than that of the incident gamma rays. The underlying organic resist material is highly absorptive of these secondary emissions, which are actinic with respect to the organic resist, causing it to become chemically converted. The high cross-section (absorptivity) of the underlying organic resist to the secondary emissions, and its close juxtaposition to the overlying secondary resist film, limit the amount of "blooming" (spreading) that would otherwise be expected to be experienced.

Other combinations of organic resist bases (or layers) either doped with high cross-section (to gamma radiation) dopants or underlying more absorptive (to gamma radiation) layers are disclosed and otherwise contemplated.

Other aspects of the invention are directed to direct-write, afocal, lithography techniques and to means for directing, concentrating, collimating and shuttering beams of radiative energy.

According to the invention, a broad incident beam of radiation can be concentrated and collimated, providing a very narrow, very intense beam of radiation (such as X-ray or gamma radiation) useful over a short range of distances as by means of a hollow, horn-shaped (e.g., conical) afocal concentrator (described extensively hereinafter). The afocal concentrator has a tapered section and a cylindrical section. The tapered section has a broad mouth at one end and a narrow opening at an opposite end. The cylindrical section has a diameter equal to that of the narrow opening, and is formed continuously therewith. A broad incident beam of radiation enters the mouth of the tapered portion and is concentrated in the tapered portion and is collimated in the cylindrical portion to provide a collimated, intense output beam that can be directed onto a semiconductor wafer. In order to produce patterns on the wafer, either the collimator or the wafer is moved (in two axes). Preferably, the wafer would moved and the concentrator would be fixed in position.

According to various aspects of the invention, the concentrator may have any of various tapered forms, including a linear, cone-shaped taper, an exponential taper, or some combination thereof. In any case, the inner surface of the afocal concentrator is highly reflective of the incident radiation.

According to various other aspects of the invention, the afocal concentrator may be used to collimate (thereby intensify) any of various forms of radiation, including gamma radiation, X-ray radiation, UV light, and visible light. In the main hereinafter, the utility of the collimator for very short wavelength radiation that cannot be focused by conventional optics is discussed.

According to other aspects of the invention, the reflective inner surface (bore) of the afocal concentrator is formed of aluminum, nickel, or chromium. The entire collimator can be formed of a single material, or its bore can be plated.

According to the invention, a surface acoustic wave (SAW) device operating as a shallow angle scattering surface, can act as a shutter for X-ray or gamma-ray radiations. In the context of the present invention, such a shutter would controllably allow/prohibit the downstream (towards the wafer, or towards the concentrator) passage of radiation from a fluent, continuous source of radiation. A thin, reflective film of, for example, aluminum, nickel, or chromium, is disposed over the surface of a Surface Acoustic Wave (SAW) device. When the SAW device is not activated, the reflective surface is substantially planar, and reflects incident radiation at an angle equal and opposite to its angle of incidence. This beam, the position of which is highly predictable, can be used to pattern a layer (e.g., photoresist) on a semiconductor wafer. A tightly collimated beam approaching the surface of the SAW (such as from the aforementioned collimator) at a known shallow angle, will be reflected off of the reflective surface of the unactivated SAW device at a predictable angle. When the SAW device is activated, however, the surface of the SAW device becomes distorted and deflects or scatters the incident beam. By providing a beam stop or an aperture and positioning it such that radiation from the incident beam will pass the beam stop (or aperture) only when reflected at an angle corresponding to its reflection off of the planar surface of the unactivated SAW device, an effective shutter is formed. Hence, the planar and distorted surface of the SAW device, in combination with a knife-edge, opaque beam stop or aperture, effectively functions as a shutter, turning an incident beam ON and OFF, respectively, particularly for very short wavelength radiation (e.g., X-rays or Gamma rays).

It is not necessary, according to the invention that the incident beam be "cleanly" reflected in any particular direction when the SAW device is activated (distorted surface). It is only necessary that the reflected beam be reflected from the SAW device anywhere other than past the beam stop or aperture when the SAW device is activated.

In a similar manner, a magnetostrictive device may be employed instead of a SAW device, in combination with a beam stop or aperture, to form an effective shutter mechanism. Again, the surface of the magnetostrictive device can selectively be made planar, to reflect incident radiation past a beam stop or aperture, or it can be made non-planar, to divert incident radiation from passing the beam stop or aperture. As with the SAW device, the magnetostrictive device is coated with a material that is highly reflective vis-a-vis the incident radiation. In either case, namely employing a SAW device or a magnetostrictive device, the reflective element acts as a "surface distortion device" for the purposes of the present invention. Other devices whose surfaces may selectively be distorted may be employed, in combination with a beam stop or aperture, to achieve a similar shuttering function.

According to various other aspects of the invention, the Surface Acoustic Wave or magnetostrictive shutter may be used to shutter radiation of a variety of wavelengths, including gamma-rays, X-rays, UV light, etc. In the main hereinafter, the utility of these surface distortion devices in conjunction with non-visible radiation is discussed.

Further, according to the invention, direct-write gamma-ray lithographic apparatus is provided. An omni-directional radiation source provides a source of intense gamma-ray radiation. A suitable radiation source is a Cobalt-60 pellet which passively (without any external power) radiates intense, fluent (e.g., steady, not varying or intermittent) gamma-ray radiation. A reflector (similar to the reflector 114 discussed with respect to FIG. 1, above) may be employed behind the Cobalt-60 pellet to improve the directionality and intensity of the emissions from the pellet. Gamma-ray radiation from the gamma-ray radiation source enters (is incident to) a shutter device, such as the SAW or magnetostrictive-based shutter devices described above. The shutter device serves to selectively gate (block or pass) the incident beam, resulting in a controlled gamma-ray beam. The controlled gamma-ray beam enters the mouth of an afocal concentrator, such as that described above and in greater detail with respect to FIG. 4 et seq. The afocal concentrator narrows, intensifies and collimates the controlled beam to provide a collimated beam. A semiconductor wafer is positioned a distance from the output of the afocal concentrator such that the collimated beam impinges upon the surface thereof. The surface of the wafer is coated with a layer of gamma-sensitive resist, such as that described above. Preferably, the wafer is mounted to a movable carriage, by which means the wafer may be positioned such that the collimated beam may be caused to impinge on any point on the resist layer, to form a pattern in the resist layer for further processing (e.g., chemical etching). This is referred to as "direct write" lithography.

The on/off state of the collimated beam may be effectively controlled by selectively activating and de-activating the shutter device. Preferably, the distance between the wafer and the output of the afocal concentrator is approximately 5 µm. Even if the collimated beam of gamma radiation is not perfectly collimated, by positioning the wafer so close to the output of the collimator, there is not much opportunity for the collimated beam to spread out.

In an alternate embodiment of the direct-write gamma-ray lithography apparatus described hereinabove, the positions of the shutter device and the afocal concentrator are reversed. In other words, the gamma radiation would be collimated, then shuttered, then caused to impinge on a semiconductor wafer.

Other objects, features and advantages of the invention will become apparent in light of the following description thereof.

BRIEF DESCRIPTION OF THE DRAWINGS

FIG. 5a is a diagram of a surface-acoustic-wave (SAW) shutter in an unactivated (shutter open) state, according to the present invention.

FIG. 5b is a diagram of a surface-acoustic-wave (SAW) shutter in an activated (shutter closed) state, according to the present invention.

FIG. 5c is a magnified (more detailed) view of a portion of FIG. 5b.

DETAILED DESCRIPTION OF THE INVENTION

Figure 1:
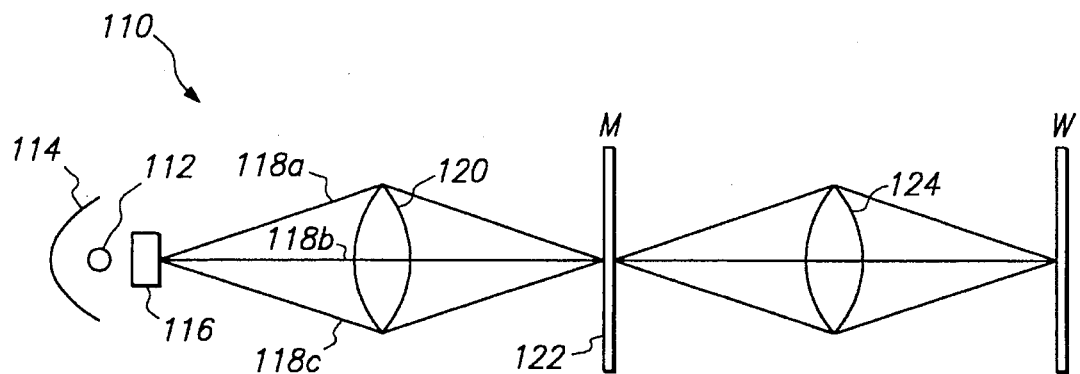
FIG. 1 is a simplified diagram of a prior-art photolithographic apparatus.

According to the invention, electromagnetic radiation of shorter, or of significantly shorter, wavelength than visible light is used for lithography of integrated circuits. Given the inherent resolution problems associated with conventional visible light and near-visible light photolithographic techniques (discussed hereinabove), the use of shorter wavelength radiation sources is highly desirable. However, due to the failure of conventional optics to perform at these short wavelengths, it is necessary to employ near-field or direct-write, afocal imaging techniques (non-focusing or non-converging optically) with short wavelength radiation sources. In this manner, by avoiding the inherent resolution problems associated with the relatively long wavelengths of light, finer (smaller) features can be defined on a semiconductor wafer. For example, fine lines can be patterned in a layer of photoresist material on the wafer and, subsequently, lines can be etched into a layer underlying the photoresist. The invention takes advantage of the situation that the apparent 'resolutions' (if you will) of etching techniques are typically much (e.g., orders of magnitude) finer than the resolution of light. Generally, "resolution" is the ability of a given medium to create patterns on another medium. As used herein, the term "lithography" means any technique of creating patterns on a semiconductor wafer (or on a photoresist layer on the wafer). By providing higher (than light) resolution lithography techniques, the invention affords the opportunity to create finer, more densely packed features and devices on a semiconductor device. For example, more transistors can be formed on a die of given area, and more conductive lines (e.g., polysilicon or metal) can be provided in a given area. The size (width) of conductive lines is a measure of process resolution (sometimes called "process geometry"). Present photolithographic techniques, limited as they are by the relatively long wavelengths of light, are limited to approximately 0.5 µm. By using the techniques disclosed herein, which involve employing radiation of shorter or significantly shorter wavelengths than light, conductive lines that are smaller, and much smaller than 0.5 µm can be created on semiconductor devices. For example, lines having a width of less than "w" microns can readily be fabricated on semiconductor devices, where "w" is below 0.5, 0.4, 0.3, 0.2, 0.1, and smaller. Current densities in such "fine" lines evidently needs to be controlled (or limited). In order to increase the current-carrying capability of such fine lines, it is also contemplated herein that the height (above the surface of the wafer) of such lines must be maximized For example, a line having a width of 0.1 µm can be formed that has a height "h" of 0.2 µm, in which case the h:w "aspect ratio" of the line would be on the order of 2:1. According to an aspect of the invention, which is provided herein mainly as a "rule of thumb", fine conductive lines have a height-:width (h:w) aspect ratio of at least "x", where "x" is 1.2:1, 1.3:1, 1.4:1, 1.5:1, 1.6:1, 17:1, 1.8:1, 1.9:1, 2:1, 2.5:1, 3.0:1, 3.5:1, 4.0:1, 4.5:1 or 5.0:1. Preferably, "x" is at least 2.0:1.

In contrast to a technique that provides only narrow lines, without allowing for increased line density (see, e.g., U.S. Pat. No. 5,139,904, described above), the present invention allows for both finer lines and for packing fine lines close together.

In one embodiment of the invention, integrated circuit (semiconductor) lithography is performed using X-ray emissions as the actinic source. As described hereinabove, the use of short-wavelength radiation sources, such as X-rays, for semiconductor lithography is less wavelength resolution-limited than light for fabricating small-geometry (sub-micron cd) integrated circuits. The short wavelength ($10^{-8}$–$10^{-11}$ meters) of X-ray radiation is well suited to providing the resolution required for the formation of very small sub-micron semiconductor features in semiconductor devices.

Some efforts have been made to use X-ray lithography. However, such efforts are plagued with difficulties. Present image mask substrate materials include silicon carbide, polyimide, and silicon dioxide. These masking substrate materials suffer from a number of shortcomings relative to X-ray lithography. Among these are:

1) present X-ray image mask substrates exhibit extremely poor transparency to X-rays, yielding masks which provide poor contrast;

2) the poor transparency of present X-ray mask substrate materials forces the use of extremely thin substrates, resulting in very fragile image masks;

3) present X-ray mask substrate materials are subject to humidity-induced distortions, yielding image masks of poor stability, and causing unpredictable critical dimensions and feature positions in a resist material exposed by such image masks;

4) the expansion and adhesion characteristics of the opaque materials patterned on present mask substrates result in pattern-dependent distortions of the thin image mask substrates; and 5) present X-ray image mask substrate materials have poor "windows of transparency" (ranges of wavelengths for which they are transparent) which do not include the wavelength of the most desirable (shortest) X-ray wavelengths and the most intense available X-ray sources.

Further, an image mask formed from these substrate materials is subject to an overall distortion within the "carrier" to which it is mounted due to different rates of thermal expansion between the image mask and the carrier. When heated, present X-ray image masks distort to an unacceptable level, thereby requiring exotic processing techniques.

According to the invention, Beryllium metal (chemical symbol Be) is used as an X-ray image mask substrate. Beryllium has many desirable characteristics which make it quite suitable for use as an X-ray image mask substrate. These desirable qualities of beryllium include:

1) good transparency to X-rays;

2) viability of formation into thicker (than present) mask substrates due to its good X-ray transparency;

3) insensitivity to moisture-induced distortion;

4) excellent Young's modulus to resist distortion;

5) expansion characteristics more compatible with those of available opaque masking materials and carrier materials.

6) a wide window of transparency, permitting the use of high-intensity X-ray sources of the shortest wavelengths possible.

According to the present invention, a Beryllium substrate is used as a planar image mask substrate upon which a patterned layer of X-ray opaque material is disposed.

In conjunction with the use of a beryllium substrate for the X-ray exposure mask, the following materials make excellent X-ray opaqueing materials, for forming patterns on the image mask: gold (chemical symbol Au), tungsten (chemical symbol W), platinum (chemical symbol Pt), barium (chemical symbol Ba), lead (chemical symbol Pb), iridium (chemical symbol Ir), and rhodium (chemical symbol Rh). These materials have excellent opacity to X-rays, are relatively insensitive to moisture and are highly corrosion resistant. Further, these materials will adhere adequately to a beryllium substrate, thereby making the combination of these materials patterned on a beryllium substrate ideal for X-ray lithography of semiconductor devices. The thickness of the masking material can be empirically determined for each material (e.g., for gold) and based upon the parameters of the specific X-ray source employed. The mask pattern should be substantially opaque to the X-ray emissions, thereby providing high contrast on the image mask.

Since, like beryllium, these masking materials (e.g., gold) are all metals, their thermal coefficients of expansion are highly compatible (substantially equal) to the thermal coefficient of expansion of the beryllium image mask substrate. This serves to reduce the amount of thermally-induced pattern-dependent mask distortion as compared to that experienced with present mask and substrate materials. The insensitivity of the inventive combination of masking materials and substrate to humidity serves to substantially eliminate pattern-dependent mask distortion due to humidity.

According to the present invention, an X-ray mask is formed by providing a substantially planar beryllium substrate, and disposing upon the substrate a patterned opaque (to X-rays) layer of gold, tungsten, platinum, barium, lead, iridium or rhodium. The patterned layer may be disposed on either the "upstream" (towards the X-ray source) side of the beryllium substrate or on the "downstream" (towards the semiconductor wafer) side of the substrate.

The mask is positioned in close proximity "upstream" of a sensitized wafer (a wafer with a layer of X-ray sensitive resist). The wafer is then exposed to an upstream X-ray source through the mask, causing a downstream "shadow" image of the mask to be formed on the surface of the resist. The close proximity of the image mask to the substrate sufficiently avoids dispersion of the illuminating radiation so that a "copy" of the image mask pattern is imaged onto the sensitized (e.g., with a layer of photoresist) wafer.

The X-ray radiation is actinic with respect to the resist, and causes exposed areas of the resist to become chemically converted. After exposure to X-ray radiation, the unconverted areas of the resist (those areas of the resist which were "shadowed" by the mask) are chemically removed. (This described a "negative" mode of resist development. It is also possible to employ a "positive" resist chemistry, for which only the exposed areas of the resist are chemically removed).

Figure 2A:
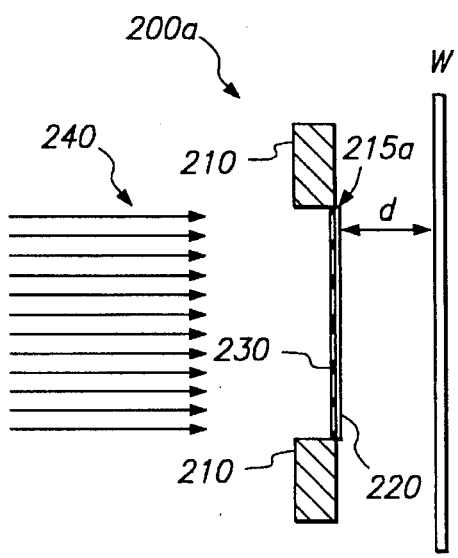
FIG. 2a is a cross-sectional view of a mask assembly, and near-field lithography apparatus, according to the present invention.

FIG. 2a is a cross-sectional view of semiconductor lithography apparatus, according to the present invention, showing an X-ray mask assembly 200a comprising an image mask 215a and a carrier 210 for the image mask 215a, according to the invention. A patterned opaque layer 230 of an X-ray masking material (e.g., gold), as described hereinabove, is disposed on the "upstream" surface (left hand surface, as shown in the Figure) of a planar beryllium substrate 220 to form the image mask 215a. The image mask 215a is fastened to the carrier 210 in any suitable manner. Preferably, the carrier 210 has a coefficient of expansion similar, or substantially identical, to that of the beryllium substrate 220. This is quite feasible since the beryllium itself is a metal. For example, the carrier 210 is also made of beryllium so that its expansion characteristics are identical to that of the beryllium substrate 220, effectively eliminating any thermally induced distortion of the mask 215a.

The image mask 215a is positioned a "near field" distance "d" upstream of a front (left, as viewed in the Figure), sensitized (e.g., with photoresist) surface of a semiconductor wafer "W" such that the plane of the image mask 215a is substantially parallel to the front surface of the wafer "W". The sensitized wafer "W" has a layer of X-ray sensitive resist (not shown) disposed upon its front surface. The wafer "W" is exposed to actinic (relative to the resist) X-ray radiation 240, which first passes through the image mask. Preferably, the distance "d" is between 0.5 and 3.0 µm, so that the image mask is sufficiently close to the front surface of the wafer to cause a pattern formed in the masking material 230 to be imaged onto the photosensitive material on the front surface of the wafer "W". At greater distances from the wafer, the imaging ability of the image mask would suffer, unless the irradiating energy were perfectly collimated. In contrast to the present invention, for photolithography using light as the irradiating source, employing a taking lens (see 124, FIG. 1) is effectively the only practical way of faithfully replicating a pattern from the image mask onto the surface of the wafer.

Figure 2B:
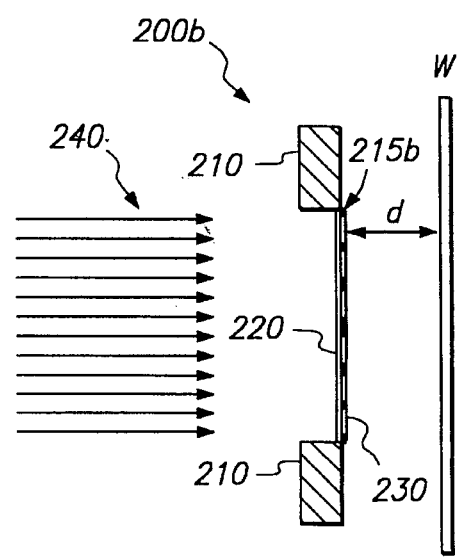
FIG. 2b is a cross-sectional view of an alternate embodiment of a mask assembly, and near-field lithography apparatus, according to the present invention.

FIG. 2b is a cross-sectional view of an alternate embodiment of an X-ray mask assembly 200b comprising an image mask 215b and carrier 210, according to the invention. A patterned opaque layer 230 of an X-ray masking material, as described hereinabove, is disposed on the "downstream" surface (right hand surface, as shown in the Figure) of a planar beryllium substrate 220 to form the mask 215b. As in the embodiment of FIG. 2a, the mask 215b is fastened to the carrier 210. In this case, however, this patterned opaque layer 230 is on the wafer side (downstream side) of the mask 215b. As described hereinabove with respect to FIG. 2a, the carrier 210 preferably has a coefficient of expansion similar to that of the beryllium substrate 220.

As with the previous embodiment (of FIG. 2a), the image mask 215b is positioned a distance "d" upstream of the front surface of a sensitized semiconductor wafer "W" such that the plane of the mask is parallel to the front (planar) surface of the wafer. The sensitized wafer "W" has a layer of X-ray sensitive resist (not shown) disposed upon its front surface. The wafer "W" is exposed to actinic (relative to the resist) X-ray radiation 240 through the mask. Preferably, the distance "d" is between 0.5 and 3.0 µm, so that the pattern formed by the masking material 230 is faithfully reproduced into the sensitized layer (e.g., of photoresist) on the semiconductor wafer "W".

The near-field, afocal, imaging (shadow imaging) technique described hereinabove with respect to FIGS. 2a and 2b is analogous to photographic contact printing, in that the mask (analogous to a negative) is placed almost directly on the wafer (analogous to photographic paper) to faithfully reproduce an image from the image mask onto the wafer, without using optics (i.e, without focusing). In the case of semiconductor device fabrication, the image on the wafer creates a pattern in a photosensitive layer on the wafer, which through subsequent removal of all but the image portions of the photosensitive layer is used to create (e.g., by etching) patterns (e.g., lines) in underlying layers (not shown) on the wafer (such as an underlying layer of polysilicon). The term "photosensitive layer" is used herein to mean a layer of material that chemically reacts (converts) in the presence of actinic (chemical conversion causing) radiation, such as X-rays.

Although the use of X-rays for semiconductor lithography is advantageous in terms of its inherent higher resolving ability (i.e., higher than light), inter alia, high-quality, fluent X-ray sources tend to be very expensive and consume a great deal of power. Hence, according to the present invention, gamma-rays can be employed (rather than X-rays) as illuminating sources for semiconductor lithography. As mentioned above, gamma-rays are even shorter in wavelength than X-rays. Hence, gamma-rays are even less resolution-limited than X-rays. Materials are available that are relatively transparent to gamma rays, and materials which are substantially opaque with respect to gamma rays. It is contemplated by this invention that these materials could be substituted for the materials described above, for making a gamma-ray based image mask for near field lithography (using a gamma ray source for illumination instead of an X-ray source). The structures and methods described herein with respect to FIGS. 2a and 2b, with such different materials, would be usable and are contemplated for gamma-ray, instead of X-ray lithography. In the main hereinbelow, the use of gamma-rays (radiation) for direct write lithography, rather than near field lithography is discussed. Generally, the use gamma-rays for lithography of integrated circuits has certain significant advantages, including:

1. extremely high source brightness (intensity), due to the extreme intensity of naturally occurring gamma-ray sources such as Cobalt-60, which is a passive source requiring no power;

2. high inherent resolution, due to short wavelength;

3. large depth of field, due to short wavelength;

4. resist materials can be fabricated (as discussed in greater detail hereinbelow) which exhibit a high cross section (absorptivity) with respect to gamma-rays, and the resist materials can be applied to a semiconductor wafer;

5. materials are available which are not only highly opaque to gamma rays, but which also emit secondary emissions (primarily in the form of photons) which can be used with conventional photoresist materials (as discussed in greater detail hereinbelow);

6. numerous chemistries are available which can be exploited to create gamma-ray sensitive resist materials (discussed in greater detail hereinbelow);

7. mechanisms are available (according to the present invention) for beam modification (as discussed in greater detail hereinbelow) and shuttering (as discussed in greater detail hereinbelow.

The use of gamma-rays as an exposure (illumination) source for integrated circuit lithography depends, of course, on the use of suitable materials for the resist process. In lithographic processes, a resist layer on the surface of a semiconductor wafer is exposed through a mask to an actinic radiation (illumination) source. The resist responds, in the areas where it is exposed (illuminated), by chemically converting. The unconverted areas are then chemically removed. (This is a "negative" process. "Positive" processes also exist whereby the exposed areas are chemically removed. Both positive and negative type processes are contemplated.) The result is a patterned etch resistant layer.

Conventional photolithography uses one of a number of organic resist materials (e.g., polystyrene, phenolformaldehyde, polyurethane, etc.). These materials are photo-sensitive (convert chemically when exposed to visible light radiation) and have good etch resist characteristics for subsequent wafer etching. These conventional organic resist materials are suitable for gamma-ray lithography in all respects except that their intrinsic absorbance of gamma-rays is very low.

As is well known in the art, silicon integrated circuits, including CMOS circuits, have a finite tolerance to gamma-ray exposure. Excessive exposure to gamma-rays can cause field inversion in MOS FETs (Metal-Oxide-Semiconductor Field Effect Transistors) leading to excessive current leakage or outright device failure, and various other serious problems.

It is necessary, therefore, to provide a gamma-sensitive resist material which either: a) requires very short exposure times, or b) provides a sufficiently high cross-section to gamma-rays (absorbs gamma-rays well enough) so that the underlying wafer is effectively "shielded" from the gamma radiation by the resist material itself.

According to the present invention, it is recognized that gamma radiation, being an ionizing radiation, is capable of causing secondary emissions in various materials. For example, when tungsten is exposed to gamma radiation, gamma radiation is effectively completely absorbed by the tungsten, and the energy of the gamma radiation causes electrons to be "ripped" from their ordinary orbits (shells) in the atomic structure of the tungsten, thereby causing the tungsten to become ionized. In the process, the change of energy levels causes the ionized tungsten to emit photons of energy at a different wavelength (secondary emissions). As will be evident from the discussion hereinbelow, these secondary emissions are compatible with (actinic with respect to) essentially conventional photoresist materials.

Tungsten, having a high inherent cross-section (absorptivity) with respect to gamma radiation, i.e., gamma radiation does not pass through it particularly well, makes an effective gamma radiation shield when present over the surface of a semiconductor device.

For example, by applying a layer of tungsten over a conventional organic resist layer (on the upstream side of the resist), the secondary emission properties of the tungsten in response to gamma radiation may be utilized to "expose" the resist, while simultaneously shielding the underlying wafer from gamma radiation. The organic resist materials have a high cross-section to the secondary radiation. Various combinations of conventional photoresist materials with tungsten added into or onto the photoresist are disclosed hereinbelow (with respect to FIGS. 3a–3d), and for purposes of this discussion are termed "compound resists". They are all effectively converted when exposed to incident gamma radiation, and can all be formulated to effectively shield the underlying semiconductor device (if necessary).

Figure 3A:
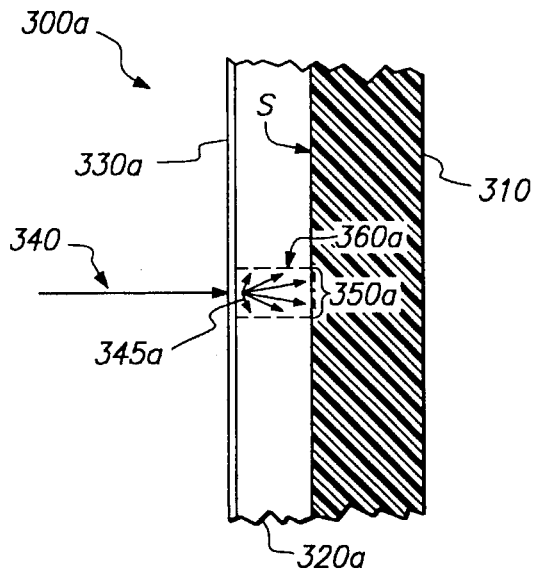
FIG. 3a is a cross-sectional view of a gamma-sensitive resist on a semiconductor wafer, according to the present invention.

FIG. 3a is a cross-sectional view of a sensitized semiconductor wafer 300a illustrating an embodiment of a gamma-sensitive compound resist. A front surface "S" of a semiconductor wafer 310 is coated with a layer 320a of photoresist, for example conventional organic photoresist material such as polystyrene, phenolformaldehyde, polyurethane, etc. Preferably, the layer of photoresist is applied as a planar layer, in any suitable manner.

A layer 330a of a material with a high cross-section to gamma radiation, such as tungsten, boron or bromine, is disposed over the resist layer 320a. This may be referred to as a "secondary resist layer"—together the layers 320a and 330a forming a "compound resist" sensitizing the front surface "S" of the wafer 310 to incident gamma radiation. Preferably, the secondary resist layer 330a is formed as a film of tungsten, and is preferably of sufficient thickness to absorb all incident gamma radiation. However, the layer 330a must also be fairly thin, to allow secondary emissions to enter the underlying resist layer 320a.

Gamma radiation 340, impinging upon the secondary-resist layer 330a ionizes the material of the secondary resist layer 330a, causing scattered secondary photons emissions 345a having a different (generally longer) wavelength than that of the gamma radiation to be emitted into the resist layer 320a. The secondary emissions 345a are preferably of substantially shorter wavelength than visible light, and are employed to convert the underlying resist material 320a. In this manner, the lithography technique of the present invention is not as resolution bound as conventional photolithography. Preferably, the secondary emissions 345a are substantially shorter in wavelength than visible light, and are nevertheless capable of converting (acting actinically with respect to) the underlying photoresist 320a.

The resist material 320a is highly absorbent of the secondary emissions 345a and thereby limits the exposure of the resist layer 320a to the secondary emissions 345a to a small area 360a about the point where the gamma radiation 340 strikes the secondary resist layer 330a. After chemically (or mechanically) stripping the secondary resist layer 330a, the unconverted areas of the resist layer 320a are removed, leaving an "island" of etch-resistant resist material over an area 350a of the semiconductor wafer 310. This describes forming a point feature on the wafer. A layer to be patterned, such as a layer of polysilicon underlying the resist is omitted for illustrative clarity (in all of FIGS. 3a–3d). With a finely collimated gamma beam in fixed position, the wafer 310 can be "walked around" so that the beam 340 can describe and convert a line of photoresist. This would be a so-called "direct write" technique for semiconductor lithography.

In the case that the gamma radiation were to impinge on the sensitized wafer 300a through a mask (not shown), two dimensional patterns could be formed directly on the photoresist 320a. This would be "near-field" semiconductor lithography (compare FIGS. 2a and 2b).

As shown in FIG. 3a, the secondary emissions 345a tend to scatter, in other words be emitted in directions at an angle to the incident beam 340. This causes a limited amount of "blooming" (or de-focusing of a pattern through an image mask). However, the intensity and direction of the gamma radiation 340 cause the bulk of the secondary emissions 345a to be emitted substantially in the direction of travel of the incident gamma beam 340. Further, high absorbency of the resist layer relative to the secondary emissions limits the amount of blooming. Further, since the secondary emissions do not travel any significant distance, their divergence from the path of the incident gamma beam is relatively insignificant (they do not have an opportunity to go in the "wrong" direction for very far). By controlling the beam diameter (in direct write applications), or by adjusting the mask pattern (in near field applications), to compensate for any blooming, it is possible to accurately control the feature size (area 350a). Vis-a-vis direct write lithography techniques, evidently the photoresist can be patterned with a fineness—having a critical dimension (cd)—substantially approaching the diameter of the beam. Techniques for creating an extremely small diameter, collimated beam of gamma radiation are discussed hereinbelow.

Another approach to making a gamma-sensitive resist from conventional organic resist materials is to make use of the same secondary emission property of a secondary material in a slightly different way. The compound gamma-resist material shown and described with respect to FIG. 3a was formed by depositing an overlying, upstream layer of a secondary emitter (330a) with a high cross-section to gamma radiation over the organic resist (320a). If instead the organic resist material is doped with the secondary emitter, a homogenous, gamma-sensitive, compound resist can be formed.

Figure 3B:
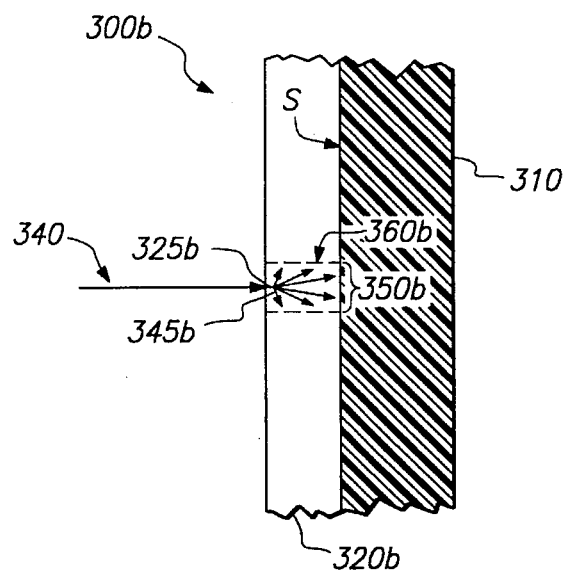
FIG. 3b is a cross-sectional view of an alternate embodiment of a gamma-sensitive resist on a semiconductor wafer, according to the present invention.

FIG. 3b is a cross-sectional view of a sensitized semiconductor wafer 300b employing a doped type of gamma-sensitive compound resist. As in FIG. 3a, an underlying layer of material to form semiconductor features (such as a layer of polysilicon) is omitted for illustrative clarity. Beginning with a base of substantially conventional, preferably organic photoresist material 320b, the photoresist 320b is doped with particles of a material which will absorb gamma rays and emit secondary emissions. A representative particle 325b is illustrated, and functions in a manner similar to the layer 345a of FIG. 3a.

Preferably, the doped, base resist layer 320b is a conventional organic resist material, such as polystyrene, phenolformaldehyde, polyurethane, etc., and it is doped with a secondary emitting dopant (e.g., dopant particle 325b) with a high cross-section to gamma radiation, such as tungsten, boron, or bromine. Gamma radiation 340 is shown impinging upon a representative secondary emitter dopant particle 325b, causing it to become ionized, resulting in scattered secondary photon emissions 345b having a different wavelength than that of the gamma radiation. The "base" (undoped) resist material is highly absorbent of the secondary emissions 345b and thereby limits the exposure of the resist layer 320b to the secondary emissions 345b to a small area 360b about the point where the gamma radiation 340 strikes the particle 325b. After exposure, the unconverted areas of the doped resist layer 320b are removed, leaving areas (points or lines) of converted compound resist over an underlying layer (e.g., polysilicon) on the front surface "S" of the wafer 310. The number of particles (e.g., 325b) required to be "mixed" into the base photoresist is determined by the intensity of the incident gamma radiation. The particles (e.g., 325b) may be uniformly distributed throughout the base photoresist, for example by mixing the particles into the photoresist material prior to applying the photoresist material to the surface of the wafer. On the other hand, the particles can be "implanted" into the surface of photoresist already applied to the surface of the wafer, in which case there will be a concentration gradient of particles more concentrated towards the surface of the photoresist (away from the wafer). Other gradients or non-uniform concentrations of particles are also contemplated.

Although the base photoresist is most sensitive to the secondary emissions (345a, 345b), it bears mention that the base photoresist may also be somewhat sensitive to the direct effects of gamma-ray irradiation. However, it is preferred that the process parameters be adjusted so that little or no gamma radiation reaches the underlying semiconductor wafer 310. Hence, the dopant concentration (or thickness of the film 330a, in FIG. 3a), as well as the transparency of the photoresist with respect to gamma radiation, as well as the sensitivity of any underlying structures to gamma radiation must be taken into account when performing the semiconductor lithography techniques of the present invention.

Again assuming that the gamma radiation reaches the sensitized wafer 300b through a mask (not shown), forming patterns of intense gamma radiation on the surface of the doped resist layer 320b, the scattering of the secondary emissions 345b causes a certain amount of "blooming" or de-focusing of the pattern, for the reasons described hereinabove. As before, the intensity and direction of the gamma radiation 340 cause the bulk of the secondary emissions 345b to be emitted substantially in the direction of travel of the gamma radiations. Even though the secondary emitter (particle 325b) is disposed within the organic resist as a dopant, it still has a high cross-section to gamma radiation and effectively shields the semiconductor wafer 310 from excessive exposure.

Both of these embodiments of gamma-sensitive resist, i.e., the two-layer compound resist described with respect to FIG. 3a and the doped compound resist described with respect to FIG. 3b, provide the desired characteristics of sensitivity to gamma radiation and inherent gamma-ray shielding, thereby acting as an effective resist while preventing excessive exposure of the underlying semiconductor wafer to gamma rays.

In the two-layer gamma-sensitive resist embodiment shown and described with respect to FIG. 3a, the secondary resist layer (330a) is not generally chemically sensitive to the incident radiation (340). It simply serves as a secondary emitter which serves to simultaneously block the incident gamma-radiation and to convert the incident radiation to another type of radiation which is actinic with respect to a resist layer (or base resist) and of which the underlying integrated circuitry (on wafer 310) is more tolerant. There are materials, however, suitable for use as a secondary emitter which are themselves chemically sensitive to exposure to gamma radiation. Further, some organic (and inorganic) resist materials are at least somewhat chemically sensitive to exposure to gamma radiation. Accordingly, it is possible to form multilayer gamma-sensitive resist coatings where the top layer (overlayer) provides secondary emissions and is also chemically converted by exposure to gamma-radiation. If the bottom layer (underlayer, between the overlayer and the wafer) is gamma-sensitive, then the use of an overlayer which does not completely block gamma radiation permits exposure of the underlayer by both direct (leaked through the overlayer) gamma radiation and by secondary emissions in the overlayer.

Several benefits are derived from the use of multilayer gamma-sensitive resist. First, the use of dual chemistries in combination permits considerably greater flexibility and versatility in determining overall resist characteristics. Second, a multilayer resist tends to permit better planarization of the resist surface. (Planar layers in semiconductor devices are generally sought-after objectives.) It is well known in the art that a truly planar surface is more easily obtained in two steps (i.e., an extremely planar surface is easier to form on top of a surface which is already substantially planar) than in one step. Improved surface planarity of a resist coating tends to enhance the linewidth uniformity of patterns created by incident radiation. (Linewidth uniformity in semiconductor layers is a generally sought-after objective.)

Figure 3C:
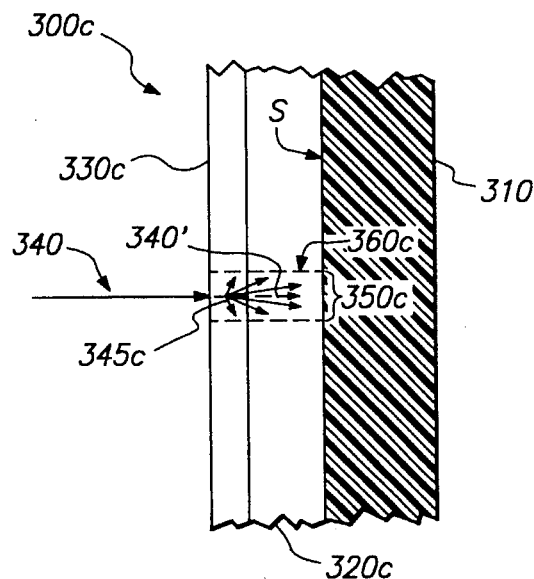
FIG. 3c is a cross-sectional view of an alternate embodiment of a gamma-sensitive resist on a semiconductor wafer, according to the present invention.
Figure 3D:
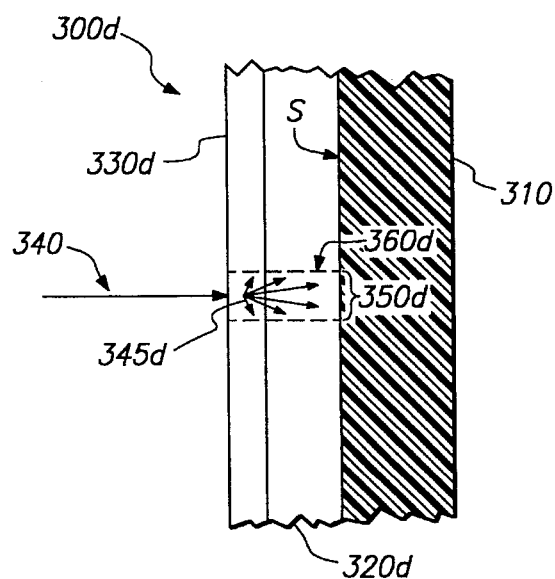
FIG. 3d is a cross-sectional view of an alternate embodiment of a gamma-sensitive resist on a semiconductor wafer, according to the present invention.

FIGS. 3c and 3d illustrate two embodiments of multilayer, gamma-sensitive, compound resists, according to the present invention.

FIG. 3c is a cross-sectional view of a sensitized semiconductor wafer 300c employing a multi-layer gamma-sensitive resist (320c/330c). A front surface "S" of the semiconductor wafer 310 is coated with a primary resist layer 320c, which is sensitive to both gamma radiation and secondary emissions. On top of this primary layer 320c is disposed a secondary gamma-sensitive resist layer 330c of a material with a relatively high cross-section to gamma radiation, but which permits some gamma radiation to pass through it. Gamma radiation 340 impinging upon the secondary resist layer 330c ionizes the material of the secondary resist layer 330c, causing scattered secondary (photon) emissions 345c which enter the primary resist layer 320c with, generally, a different wavelength than that of the gamma radiation being emitted into the secondary resist layer 330c. A portion 340' of the incident gamma radiation 340 (indicated by dashed line and arrow) passes through the secondary resist 330c and into the primary resist 320c. The primary resist material is highly reactive to the secondary emissions 345c and thereby limits the exposure of the primary resist layer 320c to the secondary emissions 345c to a small area 360c about the point where the gamma radiation 340 strikes the secondary resist layer 330c. The primary resist 320c is also chemically sensitive to the "leaked" gamma radiation 340' (gamma radiation is actinic to the primary resist), a factor which enhances the chemical conversion of the primary resist 320c, improving contrast. After chemically "developing and stripping the unconverted areas of the primary and secondary resist layers 320c and 330c, respectively, an "island" of etch resist remains over an area 350c of the semiconductor wafer 310 as shown. Complete patterns may be formed on the resist layers, in the manner described above, and the resist pattern may be transferred to an underlying layer (not shown) as described above.

FIG. 3d shows another arrangement of a sensitized semiconductor wafer 300d employing a multilayer gamma-sensitive resist. Again, a front surface "S" of semiconductor wafer 310 is coated with a primary resist layer 320d. Preferably, the resist layer 320d is a conventional organic resist material, such as polystyrene, phenolformaldehyde, polyurethane, etc. A secondary gamma-sensitive resist layer 330d of a gamma-sensitive material with a high cross-section to gamma radiation is disposed over the resist layer 320d. Gamma radiation 340, impinging upon the secondary resist layer 330d simultaneously chemically convents and ionizes an area of the material of the secondary resist layer 330d, causing scattered secondary (photon) emissions 345d, generally having a different wavelength than that of the gamma radiation 340 being emitted into the secondary resist layer 330d. The secondary resist material 330d is highly absorbent of the secondary emissions 345d and thereby limits the exposure of the primary resist layer 320d to the secondary emissions 345d to a small area 360d about the point where the gamma radiation 340 strikes the secondary resist layer 330d. The high cross-section of the secondary resist layer 330d to gamma radiation prevents leakage of gamma radiation 340 through the secondary resist layer 330d into the primary resist layer 320d and the underlying wafer 310, thereby limiting the exposure of the wafer 310 to gamma radiation. After chemically developing and stripping the unconverted areas of the primary and secondary resist layers 320d and 330d, an "island" of etch resist remains over an area 350d of the semiconductor wafer 310 as shown. Patterning and processing is performed as described above.

The compound resists described above With respect to FIGS. 3a–3d are useful for either near field or direct write lithography, both of which processes are afocal. Near field lithography utilizes an image mask in close proximity to the sensitized surface of the wafer, as described with respect to FIGS. 2a and 2b, and is preferably performed with X-ray radiation. Direct Write lithography is preferably performed with gamma-rays, and requires a tightly focused or collimated beam of radiant energy directed to specific locations of a resist layer, thereby exposing and chemically converting those areas and forming patterns for processing lines and the like in layers underlying the resist layer. However, both X-ray and gamma-ray radiation may be used for either direct-write or near-field lithography, such combinations being contemplated herein as within the scope of the present invention.

Because of the high inherent resolution capability of gamma radiation (short wavelength), the prospect of direct-write gamma lithography is very attractive. In order to accomplish this, however, it is necessary to provide, in addition to the gamma-sensitive resists described hereinabove, means for generating a tightly focused or collimated beam of gamma radiation, and means for "shuttering" or gating the beam. Suitable means for collimating and shuttering are described hereinbelow with respect to FIGS. 4 and 5a–c, respectively.

According to the invention, a broad incident beam of radiation (or a radiant point source) can be concentrated and collimated, providing a very narrow, intense beam of radiation useful over a range of distances. This is accomplished by using a hollow, horn-shaped (or conical) afocal concentrator of the type schematically depicted in FIG. 4.

Figure 4:
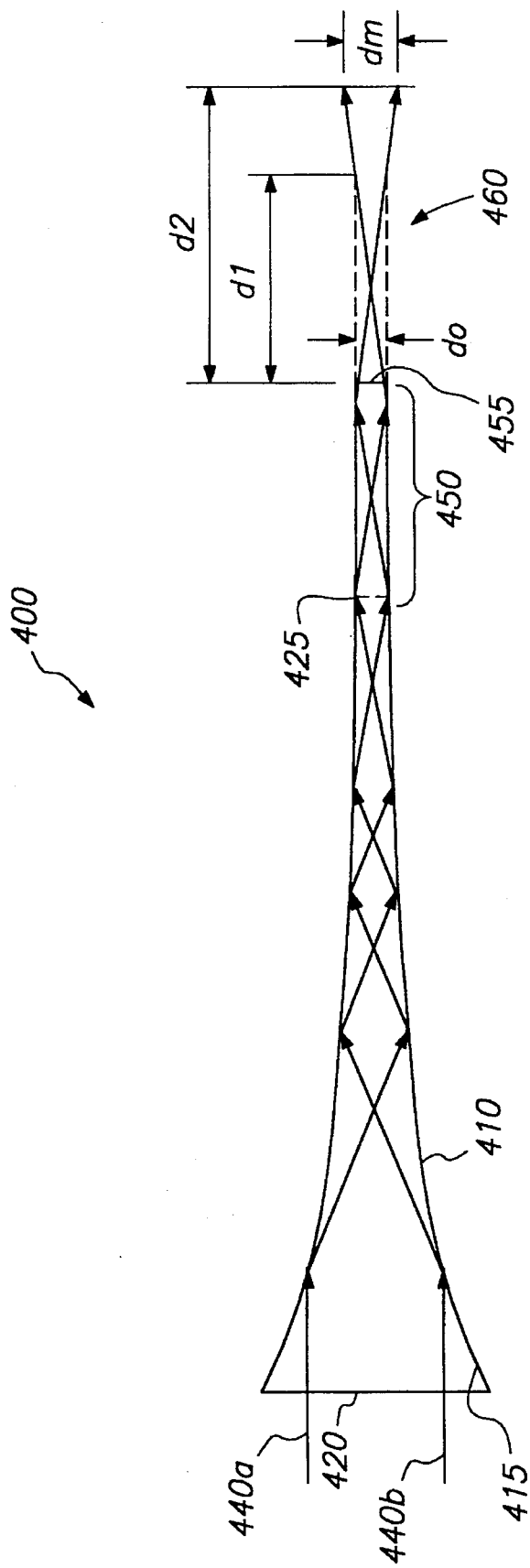
FIG. 4 is a schematic diagram of an afocal concentrator, according to the present invention.

FIG. 4 is a diagrammatic view of an afocal concentrator 400 for providing a very narrow, collimated beam of radiation. The afocal concentrator 400 has a tapered input (upstream) section 410 and an optional cylindrical output (downstream) section 450. The tapered section has a broad upstream mouth 420 (analogous to the bell of a trumpet) and a narrow opening 425 at an opposite downstream end thereof. The cylindrical section 450 has a diameter "do" equal to the diameter of the narrow opening 425, and is preferably formed contiguously therewith (i.e., the tapered and cylindrical sections are preferably formed as a unit structure). A relatively broad incident beam of radiation (e.g., gamma radiation) enters the mouth 420 of the tapered portion 410. (Such a beam could be generated by any suitable means including by a chemical radiant source, with or without a backing reflector.) The radiation beam is indicated by representative rays 440a and 440b entering opposite outer peripheral (circumferential) portions of the mouth 420. In the tapered section 410 as shown, the taper is approximately exponential, however any tapered form (e.g., a linear taper forming a conical shape), may be employed. An inner surface 415 of the afocal concentrator 400 is reflective of the incident radiation, and serves to reflect and concentrate the incident radiation towards the narrow opening 425 of the tapered section 410. For example, the tapered section could be formed of aluminum, nickel or chromium, or plated with the same on its inner surface (bore), to reflect and concentrate gamma rays. The cylindrical section 450, which should also have a highly reflective bore, serves to further collimate this concentrated radiation beam, providing an intense, narrow, collimated output beam 460 at an output end 455 thereof.

In practice, the output beam 460 is not perfectly collimated and will diverge to some degree. However, over a first distance, d1, the output beam 460 remains roughly converged to within approximately the diameter 'do' of the output end 455 of the cylindrical section 450 (or of the narrow opening 425 if the cylindrical section 450 is not Used). Assuming a maximum useful (for direct write lithography) beam diameter "dm", the output beam 460 is useful over a distance of up to "d2" (d2>d1, as shown here) from the output end 450 of the cylindrical section (or of the narrow opening 425 if the cylindrical section 450 is not used). The longer the afocal concentrator 400, especially the longer the tapered portion of the concentrator, generally the better the collimation of the output beam 460 can be (i.e., long taper=less beam divergence). The dimension "d2" represents the useful effective (for direct write lithography) depth of field of the concentrator 400.

In practice, for direct write semiconductor lithography, a radiant source, such as a pellet of Cobalt-60, is placed as close to the mouth of the concentrator as possible. As mentioned hereinabove, the emissions from the source can be directed more-or-less exclusively towards the mouth of the concentrator 400 by providing a reflector (compare 114, FIG. 1) upstream of the source (compare 112, FIG. 1). The resultant output beam 460 exiting the concentrator 400 is intense, adequately collimated, highly fluent (given a fluent source such as Cobalt-60), and very highly homogenous (minimal or negligible hot spots in the cross section of the beam 460 due to the many reflections experienced by the beam in the concentrator 400).

Exemplary dimensions for the concentrator, for semiconductor lithography are: Preferably, the mouth of the concentrator is between 50 μm and 60 μm in diameter, and the output diameter "do" is less than 0.5 μm in diameter. The output diameter "do" can be made as small as desired, for example 0.1 μm, for converting extremely small areas of resist material on a semiconductor wafer (compare 360a–d in FIGS. 3a–d). Evidently, to form converted lines in the resist material, in a direct-write application, one or the other of the concentrator 400 or the semiconductor wafer must "walk around" in the plane of the wafer surface (or the appropriate differential angle may be utilized to target areas without perpendicular beam impingement). Given the relative complexities of walking around the concentrator or the wafer, it is preferred that the concentrator remain stationary and that the wafer be moved around in a plane (X-Y positioning). High resolution positioning platforms are available for "walking" the wafer around. Given a "passive" gamma source such as Cobalt-60, it is evident that a mechanism must be provided for gating (turning on and off) the output beam (460). Else, walking around the wafer would produce an endless line. A shutter mechanism for gating the output beam is described below with respect to FIGS. 5a–c.

Although the rays 440a and 440b are shown in FIG. 4 as parallel rays entering the "bell" (mouth 420) of the concentrator 400, the rays of the incident beam need not be parallel (collimated). The concentrator will collimate input rays that are not parallel. However, the less parallel the input rays, the more collimation must be performed by the collimator. These factors need to be taken into account in the design of an overall lithography system. The better the initial collimation of the incident beam, the better the ultimate collimation of the output beam. One way to improve the input collimation is to position the source of the incident beam distant from the mouth of the concentrator (relative to the size of the concentrator). This serves to make the rays of the incident beam that actually enter the mouth of the concentrator more parallel with one another, thereby improving output collimation. If the source is positioned far away from the mouth of the collimator, it is also possible to use a cylindrical pipe (not shown) between the source and the mouth of the concentrator to help collect and direct radiation from the source. For example, a Cobalt-60 pellet could be placed in a closed end of a cylindrical tube, the closed end serving as=an upstream reflector. The tube would be oriented coaxial to the concentrator, with its downstream open end placed adjacent the mouth of the concentrator. The inside surface of the tube would be highly reflective. In this manner, emissions of gamma radiation into the environment (other than towards the wafer) could be minimized.

Although the instant application of the afocal concentrator 400 is to concentrate a gamma radiation beam, the same technique is applicable to any form of radiation source, including X-rays, UV light, and visible light. A major difference between such afocal concentrators for different radiation sources would be the material of which the inner surface of the concentrator (e.g., 415) is formed (or plated). The main requirement for the material of the inner surface of the concentrator is that it be reflective of the range of wavelengths in the incident beam. Aluminum is reflective of many different radiation wavelengths, including gamma radiation, and is suitable for gamma lithography. Nickel and Chromium are also suitably reflective materials. It is within the spirit and scope of the present invention that the afocal concentrator described hereinabove be applied to concentrate any suitable radiation source. The bore size of the concentrator also depends on the desired size of the output beam. Extremely small bore diameters can be formed by etching, ion milling, and other "machining" techniques which are known. Although the concentrator may be somewhat expensive to manufacture with precision, its cast will readily be amortized over the course of fabrication for a great number of semiconductor devices. And, as mentioned hereinabove, a passive source, such as Cobalt-60, provides a great deal of energy without consuming any external power.

A shutter mechanism for gating the output beam from the concentrator is described hereinbelow with respect to FIGS. 5a–c.

According to the invention, a surface acoustic wave (SAW) device operating as a shallow angle reflecting/scattering surface, can operate as a shutter element for X-ray or gamma-ray (or other) radiations. A thin, reflective film of, for example, aluminum, nickel, or chromium, is disposed over the surface of a Surface Acoustic Wave (SAW) device. Assuming that the SAW device is not activated, the reflective surface is substantially planar, and reflects any incident energy (e.g., a beam of gamma rays) at an angle equal and opposite to its angle of incidence. A tightly collimated beam approaching at a known shallow angle, will be reflected off of the reflective surface of the unactivated SAW device at a predictable shallow angle. If the SAW device is activated, however, the surface of the SAW device becomes distorted and deflects or scatters the incident beam. By providing a beam stop or an aperture, and positioning the beam stop or aperture such that radiation from the incident beam will pass the beam stop or aperture only when shallow-angle-reflected off of the surface of the SAW device, an effective shutter mechanism can be implemented.

FIGS. 5a–c illustrate the operation of this Surface Acoustic Wave shutter device, as exemplary of a shallow-angle-reflection, distortable-surface shutter mechanism. SAW devices are generally known for other (than the shallow angle shutter disclosed herein) purposes, such as for imposing propagation delays on travelling waves, allowing particular wavefronts to be selectively "picked off" from the end of the SAW device.

FIG. 5a is a side view of a shutter mechanism 500 employing a SAW device in its unactivated (planar, non-deformed surface) state. The shutter is formed of a Surface Acoustic Wave device 510 with a planar top surface upon which a reflective film 510a is disposed, and a strategically positioned beam-stop (or "knife edge") 520. A collimated (directional) incident beam 540 approaches the reflective surface 510a of the Surface Acoustic Wave device 510 at a shallow angle, and is reflected by the reflective surface 510a at an equal and opposite angle, forming a reflected beam 540a. The trajectory of the reflected beam is such that it misses the beam stop 520 and continues traveling along the same trajectory.

FIG. 5b is a side view of the shutter mechanism 500 of FIG. 5a, with the Surface Acoustic Wave device in an activated (surface-deformed) state. Electrical stimulation of the Surface Acoustic Wave device causes surface Waves 530 or distortions (shown greatly exaggerated) to be formed on the reflective surface 510b. For the same shallow angle incident beam 540 (compare FIG. 5a), these surface distortions 530 cause the reflected beam 540b to be scattered or diverted relative to the position of the reflected beam 540a from the unactivated Surface Acoustic Wave device 510. In other words, the beam 540b is reflected at a different angle off the distorted surface than the beam 540a is reflected from the undistorted surface of the SAW device. As a result, the reflected beam strikes the beam stop 520 and is blocked thereby such that the reflected beam does not exit the Surface Acoustic Wave shutter 500. By selectively energizing (activating) the SAW device, the beam 540 is effectively gated (turned on and off). This allows discrete lines (e.g., of converted resist material) to be formed on the surface of a semiconductor device.

FIG. 5c is a greatly enlarged (magnified) view of a portion of the Surface Acoustic Wave shutter device 510, in the surface-distorted state shown in FIG. 5b, showing the point of reflection. As before, the distortions are shown greatly exaggerated. A reference line 550 indicates the location and angle of the undistorted surface (see, e.g., 510a). A tangent line 560 indicates the angle of the reflective surface 510b at the point of reflection. The incident beam 540, approaches the reflective surface 510b of the Surface Acoustic Wave device 510 at a shallow incident angle $\Theta ih$ relative to the horizontal (i.e., relative to the reference line 550). However, due to the distortion of the reflective surface 510b, the effective angle of incidence relative to the tangent line 560 is a steeper angle, shown as $\Theta i$, where $\Theta i > \Theta ih$ (as shown). As a result, the incident beam 540 is reflected as a reflected beam 540b at a reflection angle of $\Theta r = \Theta i$ relative to the tangent line 560. The effective reflection angle $\Theta rh$ of the reflected beam 540b relative to the reference line 550 (horizontal plane) is even greater (as shown). By this mechanism, the incident beam 540 can be reflected such that it is either blocked or passed by a beam stop or aperture under electrical control. Note that the beam stop 520 effectively forms an "aperture" with the surface 510a of the Surface Acoustic Wave device 510. Alternatively, an aperture may be provided instead of a "knife-edge" style of beam stop 520.

It is not necessary, according to the invention that the incident beam 540 be "cleanly" reflected in any particular direction. It is only necessary that the reflected beam 540b be reflected anywhere other than past the beam stop or aperture 520.

It will readily be apparent to one of ordinary skill in the art that a magnetostrictive device may be substituted for the Surface Acoustic Wave device 510 to accomplish a similar result (directing and diverting a beam of incident radiation). Both magnetostrictive and Surface Acoustic Wave devices act as a sort of "surface distortion device" for the purposes of the present invention. Any device that can reflect an incident beam at one angle in one energized state (e.g., not energized), and reflect an incident beam at another angle in another energized state (e.g., energized), in conjunction with a beam stop or aperture allowing a reflected beam to pass only at a critical angle, can be employed in the instant inventive shutter mechanism. An advantage of using a surface distortion device, rather than a device which must physically be positioned, is that the response time of such surface distortion devices is relatively quick. This enables such a device, in conjunction with a beam stop or aperture, to be used as a high-speed shutter (e.g., no moving parts).

It will also be readily apparent to one of ordinary skill in the art that this type of shutter device may be applied to radiation of a variety of wavelengths, including gamma-rays, X-rays, UV light, etc. It is within the spirit and scope of the present invention that the SAW (or magnetostrictive) shutter device described hereinabove be applied as a high-speed shutter to any suitable form of radiation beam.

Figure 6A:
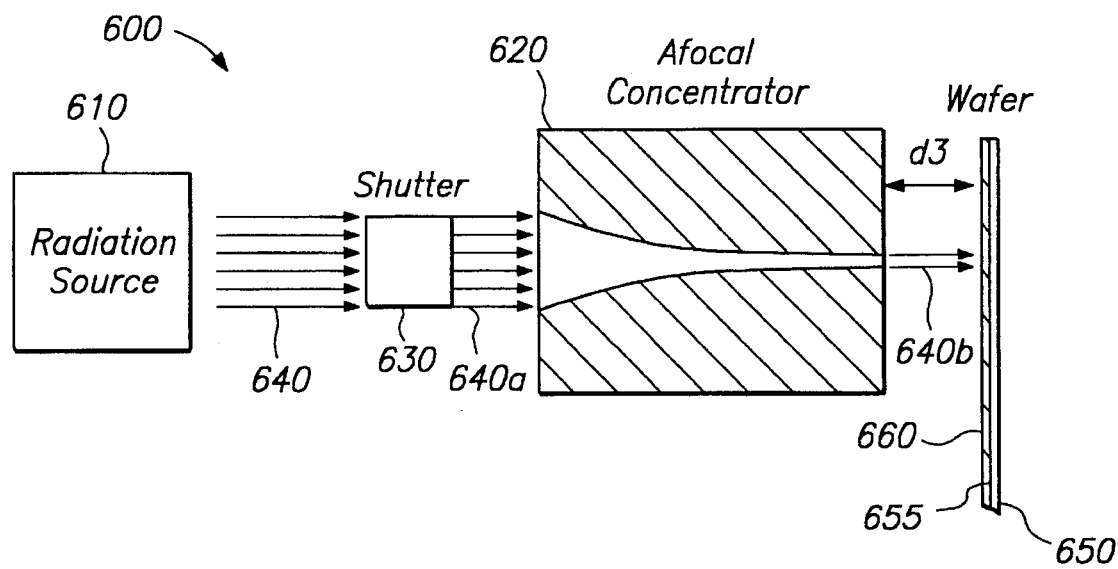
FIG. 6a is a side view, partially in cross-section, of an embodiment of a short-wavelength, afocal, direct-write, lithography system, according to the present invention.
Figure 6B:
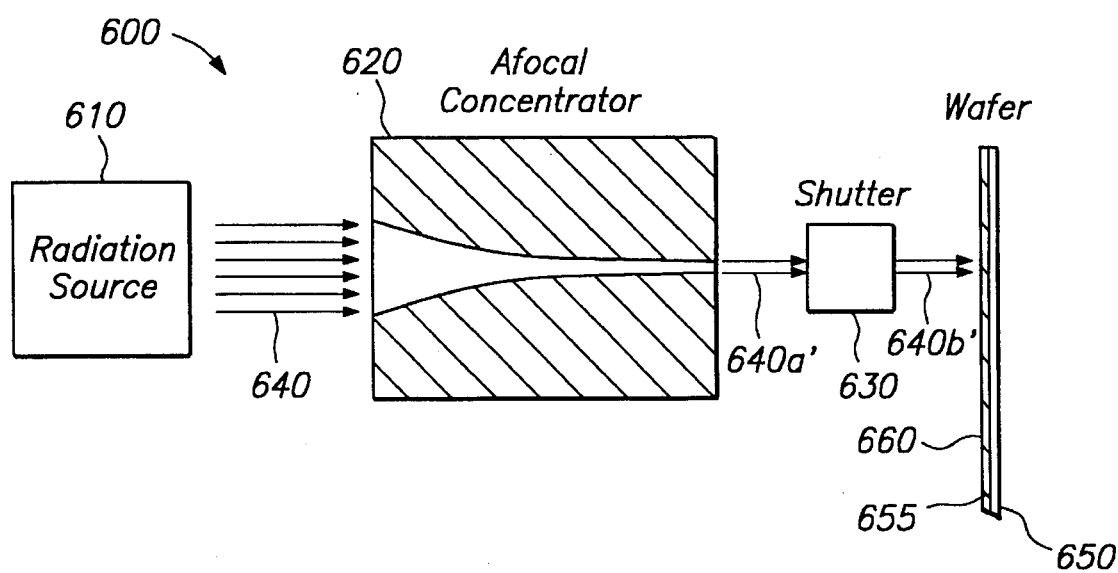
FIG. 6b is a side view, partially in cross-section, of an alternate embodiment of a short-wavelength, afocal, direct-write, lithography system, according to the present invention.

FIGS. 6a and 6b are block diagrams of (gamma-ray) direct-write lithographic apparatus employing the techniques described hereinabove with respect to FIGS. 3a–d, 4, and 5a–c; or for a near-field lithographic apparatus employing the techniques described hereinabove with respect to FIGS. 2a–b, 3a–d 4 and 5a–c.

FIG. 6a is a block diagram of a direct-write (or energy source for near-field; gamma-ray, x-ray or other radiation) lithography (lithographic) apparatus 600a, according to the present invention. A radiation source 610 provides a source of intense directional gamma-ray (or x-ray, or other radiation, collectively herein called "gamma-ray") radiation. A suitable passive gamma radiation source is Cobalt-60 which passively radiates intense gamma-ray radiation. A reflector (such as that shown and described as 114 with respect to FIG. 1) may be employed to improve the directionality and intensity of the source 610. Given any shutter 630, or other "on/off" mechanism, the beam 640 need not be very well collimated. Given a shutter 630 such as was described with respect to FIGS. 5a–5c, a collimator similar to that shown in FIG. 4 could be employed to direct the beam 640 into the shutter 630.

Incident gamma-ray radiation 640 from the gamma-ray radiation source 610 enters a shutter device 630, such as the Surface Acoustic Wave shutter device shown and described as 500 with respect to FIGS. 5a–5c. The shutter device 630 serves to selectively gate (block or pass) the incident beam 640, resulting in a controlled gamma-ray beam 640a. The controlled gamma-ray beam 640a enters the mouth of an afocal concentrator 620, such as that shown and described (400) with respect to FIG. 4. The afocal concentrator narrows and intensifies the controlled beams 640a to provide a collimated beam 640b. A semiconductor wafer 650 is positioned a distance "d3" from the output of the afocal concentrator 620 such that the collimated beam impinges upon the front surface 655 thereof. The front surface 655 of the wafer 650 is coated with a layer 660 of gamma-sensitive resist, such as that shown and described as 320a–d (and optionally 330a, c–d) with respect to FIGS. 3a–3d, respectively. Preferably, the wafer is mounted to a movable carriage (not shown) for direct-write application, by which means the wafer 650 may be positioned such that the collimated beam 640b may be caused to impinge on any point on the resist layer 660. The on/off state of the collimated beam 640b may be effectively controlled by selectively activating and de-activating the shutter device 630. Preferably, the distance "d3" is approximately 5 µm. Preferably, the distance "d3" should be no greater than the distance "d2" shown in FIG. 4.

FIG. 6b is a block diagram of an alternate embodiment of a direct-write gamma-ray (or x-ray or similar radiation, collectively herein called "gamma-ray") lithographic apparatus 600b, according to the invention. As before, a radiation source 610, such us Cobalt-60, provides a source of intense directional gamma-ray radiation. A reflector (such as that shown and described as 114 with respect to FIG. 1) may be employed to improve the directionality and intensity of the source 610. Incident gamma-ray radiation 640 from the gamma-ray radiation source 610 enters the mouth of an afocal concentrator 620, such as that shown and described (400) with respect to FIG. 4. The afocal concentrator narrows and intensifies the incident gamma-ray radiation 640 to provide a collimated gamma-ray beam 640a'. The collimated gamma-ray beam 640a' enters a shutter device 630, such as the Surface Acoustic Wave shutter device shown and described as 500 with respect to FIGS. 5a–5c. The shutter device serves to selectively gate (block or pass) the collimated gamma-ray beam 640a', resulting in a collimated, controlled gamma-ray beam 640b'. A semiconductor wafer 650 is positioned a distance "d3" from the output of the afocal concentrator 620 such that the controlled collimated beam 640b' impinges upon the front surface thereof. The front surface 655 of the wafer 650 is coated with a layer 660 of gamma-sensitive resist, such as that shown and described as 320a–d (and optionally 330 a, c–d) with respect to FIGS. 3a–3d, respectively. Preferably, the wafer 650 is mounted to a movable carriage (not shown) for direct-write application, by which means the wafer 650 may be positioned such that the collimated controlled beam 640b' may be caused to impinge on any point on the resist layer 660. The on/off state of the collimated controlled beam 640b' may be effectively controlled by selectively activating and de-activating the shutter device 630. In this configuration, the shutter device 630 is between the output of the concentrator 620 and the wafer 650. Hence, the shutter 630 must be made small. Small SAW (or magnetostrictive) devices can be fabricated to meet this criteria. It is also possible (in any of the examples set forth herein) that the beam may be reflected off a suitable reflecting surface (not shown) so that it initially approaches the wafer 650 at an angle (e.g., parallel, or between parallel and normal) to the surface of the wafer) and is reflected by the reflector to ultimately impact the wafer at ninety degrees (normal) to the surface of the wafer.

It is within the spirit and scope of the present invention that the inventive techniques described hereinabove be used either alone or in combination. By employing these techniques, viable forms of short-wavelength (e.g., gamma-ray or X-ray) afocal lithography may be realized. It should also be recognized that many of the techniques described hereinabove may be applied to other types of radiation, such as UV light or visible light.

We claim:

1. A semiconductor lithography apparatus comprising:
   a) an X-ray source emitting X-ray radiation in a direction downstream along a path;
   b) a semiconductor wafer disposed downstream of said X-ray source across said path; and
   c) an image mask assembly comprising:
      i) a peripheral beryllium carrier disposed along said path between said X-ray source and said wafer and spaced substantially parallel to said wafer;
      ii) a beryllium substrate having a substantially planar surface and peripherally mounted to said beryllium carrier;
      iii) a patterned metal masking material disposed on said substantially planar surface of said beryllium substrate, said patterned masking material further characterized as:
         (1) relatively opaque to X-ray radiation,
         (2) adherent to beryllium,
         (3) insensitive to moisture,
         (4) resistant to corrosion, and
         (5) having a thermal coefficient of expansion substantially equal to said beryllium substrate and said beryllium carrier;
   whereby said image mask assembly, comprising a beryllium carrier, beryllium mask substrate, and masking material having a thermal coefficient of expansion substantially equal to said beryllium carrier and mask substrate, will not be subject to thermal distortion due to the use of materials having matched thermal coefficients of expansion.

2. The image mask assembly of claim 1 wherein said patterned metal masking material is selected from the group consisting of gold, tungsten, platinum, barium, lead, iridium, and rhodium.

3. The image mask assembly of claim 1 wherein said image mask assembly is spaced closely from said wafer, so that said radiation from said X-ray radiation source shadows an image of said patterned metal masking material onto said wafer.

4. A semiconductor lithography apparatus comprising:
   a) an X-ray source emitting X-ray radiation in a direction downstream along a path;
   b) a semiconductor wafer disposed downstream of said X-ray source across said path; and
   c) an image mask assembly comprising:
      i) a peripheral beryllium carrier disposed along said path between said X-ray source and said wafer and spaced substantially parallel to said wafer;
      ii) a beryllium substrate having a substantially planar surface and peripherally mounted to said beryllium carrier;
      iii) a patterned metal masking material selected from the group consisting of gold, tungsten, platinum, barium, lead, iridium, and rhodium, disposed on said planar surface of said beryllium substrate, said patterned masking material further characterized as:
         (1) relatively opaque to X-ray radiation,
         (2) adherent to beryllium,
         (3) insensitive to moisture, (4) resistant to corrosion, and
(5) having a thermal coefficient of expansion substantially equal to said beryllium substrate and said beryllium carrier;

whereby said image mask assembly, comprising a beryllium carrier, beryllium mask substrate, and masking material having a thermal coefficient of expansion substantially equal to said beryllium carrier and mask substrate, will not be subject to thermal distortion due to the use of materials having matched thermal coefficients of expansion.

5. The semiconductor lithography apparatus as in claim 4, wherein: said means for supporting said image mask orients said mask so that said masking material is downstream relative to said substrate.

6. A method of semiconductor lithography comprising the steps of:
 a) providing an X-ray source emitting X-ray radiation in a direction downstream along a path;
 b) disposing a semiconductor wafer downstream of said X-ray source across said path; and
 c) providing an image mask assembly by:
  i) providing a peripheral beryllium carrier disposed along said path between said X-ray source and said wafer and spaced substantially parallel to said wafer;
  ii) peripherally mounting to said beryllium carrier a beryllium substrate having a substantially planar surface; and
  iii) disposing, on said planar surface of said beryllium substrate a patterned metal masking material, said patterned masking material further characterized as:
   (1) relatively opaque to X-ray radiation,
   (2) adherent to beryllium,
   (3) insensitive to moisture,
   (4) resistant to corrosion, and
   (5) having a thermal coefficient of expansion substantially equal to said beryllium substrate and said beryllium carrier;

whereby said image mask assembly, comprising a beryllium carrier, beryllium mask substrate, and masking material having a thermal coefficient of expansion substantially equal to said beryllium carrier and mask substrate, will not be subject to thermal distortion due to the use of materials having matched thermal coefficients of expansion.

7. The method of semiconductor lithography of claim 6 wherein said step of disposing, on said planar surface of said beryllium substrate, a patterned metal masking material, further comprises selecting said patterned metal masking material from the group consisting of gold, tungsten, platinum, barium, lead, iridium, and rhodium.

8. The method of semiconductor lithography of claim 6 wherein said step of providing a peripheral beryllium carrier disposed along said path between said X-ray source and said wafer further comprises spacing said carrier closely from said wafer, so that said radiation from said X-ray radiation source shadows an image of said patterned metal masking material onto said wafer.

9. A method of semiconductor lithography comprising the steps of:
 a) providing an X-ray source emitting X-ray radiation in a direction downstream along a path;
 b) disposing a semiconductor wafer downstream of said X-ray source across said path; and
 c) providing an image mask assembly comprising:
  i) a peripheral beryllium carrier disposed along said path between said X-ray source and said wafer and spaced substantially parallel to said wafer;
  ii) a beryllium substrate having a substantially planar surface and peripherally mounted to said beryllium carrier;
  iii) a patterned metal masking material selected from the group consisting of gold, tungsten, platinum, barium, lead, iridium, and rhodium, disposed on said planar surface of said beryllium substrate, said patterned masking material further characterized as:
   (1) relatively opaque to X-ray radiation,
   (2) adherent to beryllium,
   (3) insensitive to moisture,
   (4) resistant to corrosion, and
   (5) having a thermal coefficient of expansion substantially equal to said beryllium substrate and said beryllium carrier;

whereby said image mask assembly, comprising a beryllium carrier, beryllium mask substrate, and masking material having a thermal coefficient of expansion substantially equal to said beryllium carrier and mask substrate, will not be subject to thermal distortion due to the use of materials having matched thermal coefficients of expansion.

10. The method of semiconductor lithography as in claim 9, wherein: said step of supporting said image mask orients said mask so that said masking material is downstream relative to said substrate.

* * * * *